(12) United States Patent
Chen et al.

(10) Patent No.: US 11,638,367 B2
(45) Date of Patent: Apr. 25, 2023

(54) ELECTRONIC DEVICE AND HEAT DISSIPATING ELECTROMAGNETIC SHIELDING STRUCTURE

(71) Applicant: Wistron NeWeb Corporation, Hsinchu (TW)

(72) Inventors: Yan-Da Chen, Hsinchu (TW); Chien-Ming Peng, Hsinchu (TW); Yu-Jen Liu, Hsinchu (TW); Chih-Chuan Lin, Hsinchu (TW); Chi-Te Lin, Hsinchu (TW)

(73) Assignee: WISTRON NEWEB CORPORATION, Hsinchu (TW)

( * ) Notice: Subject to any disclaimer, the term of this patent is extended or adjusted under 35 U.S.C. 154(b) by 22 days.

(21) Appl. No.: 17/351,465

(22) Filed: Jun. 18, 2021

(65) Prior Publication Data
US 2022/0053664 A1    Feb. 17, 2022

(30) Foreign Application Priority Data
Aug. 12, 2020   (TW) .................... 109127441

(51) Int. Cl.
*H05K 7/20* (2006.01)
*H05K 9/00* (2006.01)
*H01L 23/367* (2006.01)

(52) U.S. Cl.
CPC ......... *H05K 7/2049* (2013.01); *H01L 23/367* (2013.01); *H05K 7/20472* (2013.01); *H05K 9/0024* (2013.01)

(58) Field of Classification Search
CPC .................... H05K 9/0024; H05K 7/20472
See application file for complete search history.

(56) References Cited

U.S. PATENT DOCUMENTS

| | | | |
|---|---|---|---|
| 6,205,026 B1 * | 3/2001 | Wong ............... | H01L 23/552 |
| | | | 174/16.3 |
| 9,439,333 B2 * | 9/2016 | Daughtry, Jr. ..... | H05K 7/20418 |
| 11,348,877 B2 * | 5/2022 | Lo ................ | H05K 7/20418 |
| 2004/0052064 A1 * | 3/2004 | Oliver ............ | H01L 23/4093 |
| | | | 257/E23.114 |
| 2017/0181266 A1 * | 6/2017 | Hunt .............. | H05K 9/0032 |

FOREIGN PATENT DOCUMENTS

| EP | 2933833 A1 * | 10/2015 | ......... H01L 23/3672 |
|---|---|---|---|
| KR | 20060106008 A * | 10/2006 | .......... H04M 1/0277 |

* cited by examiner

*Primary Examiner* — Robert J Hoffberg
(74) *Attorney, Agent, or Firm* — McClure, Qualey & Rodack, LLP

(57) ABSTRACT

An electronic device includes a substrate, at least one electronic element and a heat dissipating electromagnetic shielding structure. The heat dissipating electromagnetic shielding structure is disposed on the substrate and covers the at least one electronic element, wherein the heat dissipating electromagnetic shielding structure includes a shielding frame and a heatsink. The shielding frame includes a plurality of spring members. The spring members are bent toward the substrate and partially abut against the heatsink. When the heatsink and the shielding frame are correspondingly arranged, a shielding space is defined, the electronic element is disposed in the shielding space, and a heat generated by the at least one electronic element is conducted out of the shielding space via the heatsink.

14 Claims, 8 Drawing Sheets

ELECTRONIC DEVICE AND HEAT DISSIPATING ELECTROMAGNETIC SHIELDING STRUCTURE

RELATED APPLICATIONS

This application claims priority to Taiwan Application Serial Number 109127441, filed Aug. 12, 2020, which is herein incorporated by reference.

BACKGROUND

Technical Field

The present disclosure relates to an electronic device and an electromagnetic shielding structure. More particularly, the present disclosure relates to an electronic device and an electromagnetic shielding structure including a shielding frame with a specific structure.

Description of Related Art

The operating efficiencies of electronic products or other devices are often interfered with by the electromagnetic radiation generated by the electronic products themselves during the use thereof. Accordingly, electromagnetic shielding structures are arranged in most of the electronic products on the market currently so as to prevent the electromagnetic interference (EMI) between different electronic products during the operations.

Please refer to FIG. 8, which is an exploded view of a conventional electronic device 10. As shown in FIG. 8, the electronic device 10 includes a substrate 11, an electronic element 12 and an electromagnetic shielding structure 20. The electromagnetic shielding structure 20 includes a shielding frame 21, a first thermal pad 22, a shielding cover 23, a second thermal pad 24 and a heatsink 25. The first thermal pad 22, the shielding cover 23, the second thermal pad 24 and the heatsink 25 are arranged on the electronic element 12 in a sequentially stacked form so as to achieve the aims for electromagnetic shielding and heat dissipating of the electronic element 12. However, the number of elements of the electromagnetic shielding structure 20 is high and the design thereof is more variable, so that not only the preparing process is complicated, but also the costs of material and labor are also high, and problems of the assembly allowance between elements also existed.

Therefore, how to develop an electromagnetic shielding structure, which can effectively shield the electromagnetic radiation and have a higher manufacturing efficiency, is a technical subject with commercial values.

SUMMARY

According to one aspect of the present disclosure, an electronic device includes a substrate, at least one electronic element and a heat dissipating electromagnetic shielding structure. The at least one electronic element is disposed on the substrate. The heat dissipating electromagnetic shielding structure is disposed on the substrate and covers the at least one electronic element, wherein the heat dissipating electromagnetic shielding structure includes a shielding frame and a heatsink. The shielding frame has a first opening and a second opening, wherein the first opening is covered by the substrate, and the shielding frame includes a plurality of spring members. The spring members are separately disposed on an inner edge of the second opening, wherein the spring members are bent toward the substrate. The heatsink is disposed on the shielding frame and covers the second opening, and the spring members partially abut against the heatsink. When the heatsink and the shielding frame are correspondingly arranged, a shielding space is defined by the heatsink, the shielding frame and the substrate, the at least one electronic element is disposed in the shielding space, and a heat generated by the at least one electronic element is conducted out of the shielding space via the heatsink.

According to another aspect of the present disclosure, a heat dissipating electromagnetic shielding structure, which is for performing an electromagnetic shielding to at least one electronic element disposed on a substrate, includes a shielding frame and a heatsink. The shielding frame has a first opening and a second opening, wherein the first opening is covered by the substrate, and the shielding frame includes a plurality of spring members. The spring members are separately disposed on an inner edge of the second opening, wherein the spring members are bent toward the substrate. The heatsink is disposed on the shielding frame and covers the second opening, and the spring members partially abut against the heatsink. When the heatsink and the shielding frame are correspondingly arranged, a shielding space is defined by the heatsink, the shielding frame and the substrate, the at least one electronic element is disposed in the shielding space, and a heat generated by the at least one electronic element is conducted out of the shielding space via the heatsink.

BRIEF DESCRIPTION OF THE DRAWINGS

The present disclosure can be more fully understood by reading the following detailed description of the embodiment, with reference made to the accompanying drawings as follows.

DETAILED DESCRIPTION

Figure 1:
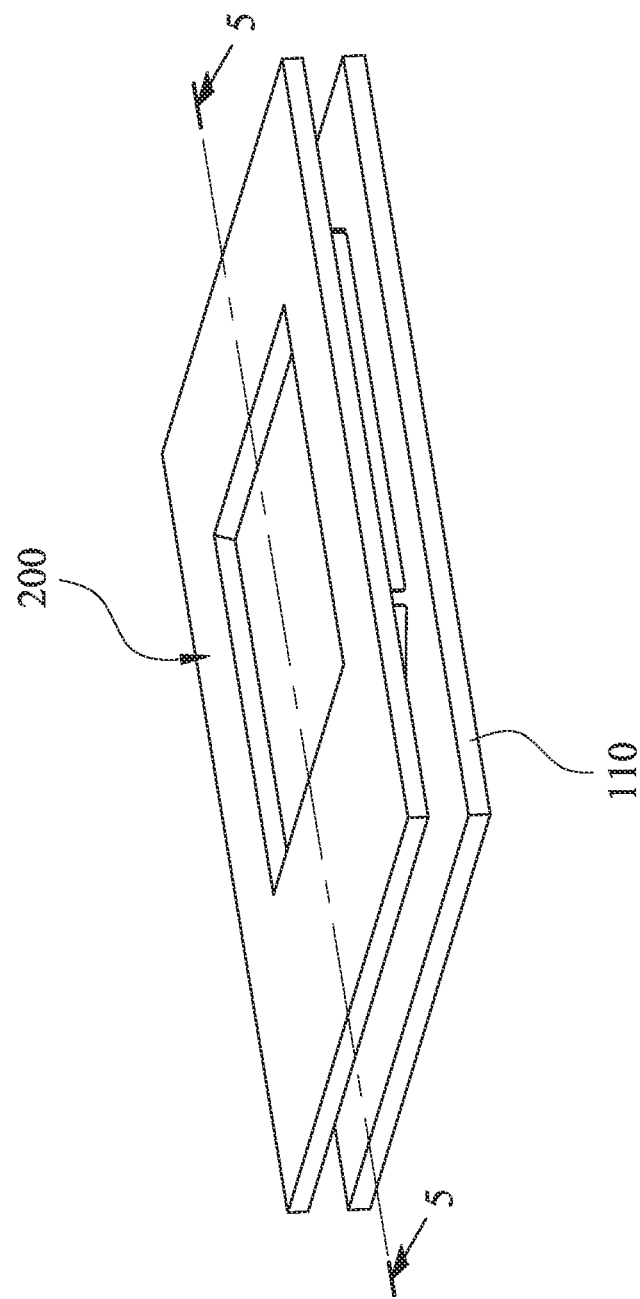
FIG. 1 is a partial schematic view of an electronic device of the present disclosure.

The present disclosure will be further exemplified by the following specific embodiments with the drawings so as to facilitate utilizing and practicing the present disclosure completely by the people skilled in the art without over-interpreting and over-experimenting. However, the readers should understand that the present disclosure should not be limited to these practical details thereof, that is, in some embodiments, these practical details are used to describe how to implement the materials and methods of the present disclosure and are not necessary. Furthermore, in order to simplify the drawings, some conventional structures and elements will be illustrated in a simple manner in the drawings, and the repeated elements may be represented by the same reference numerals.

Figure 2:
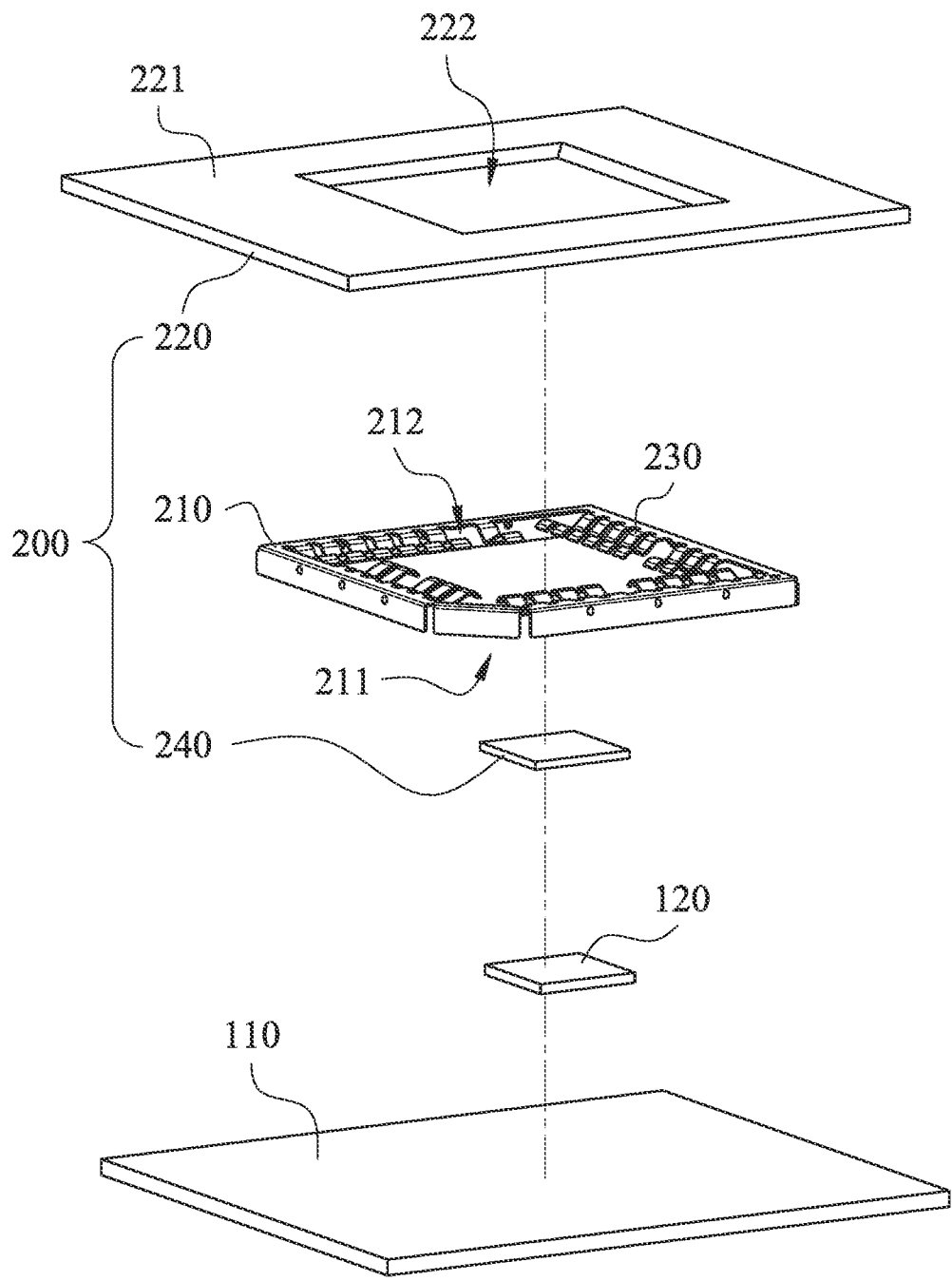
FIG. 2 is an exploded view of the electronic device of FIG. 1.
Figure 3:
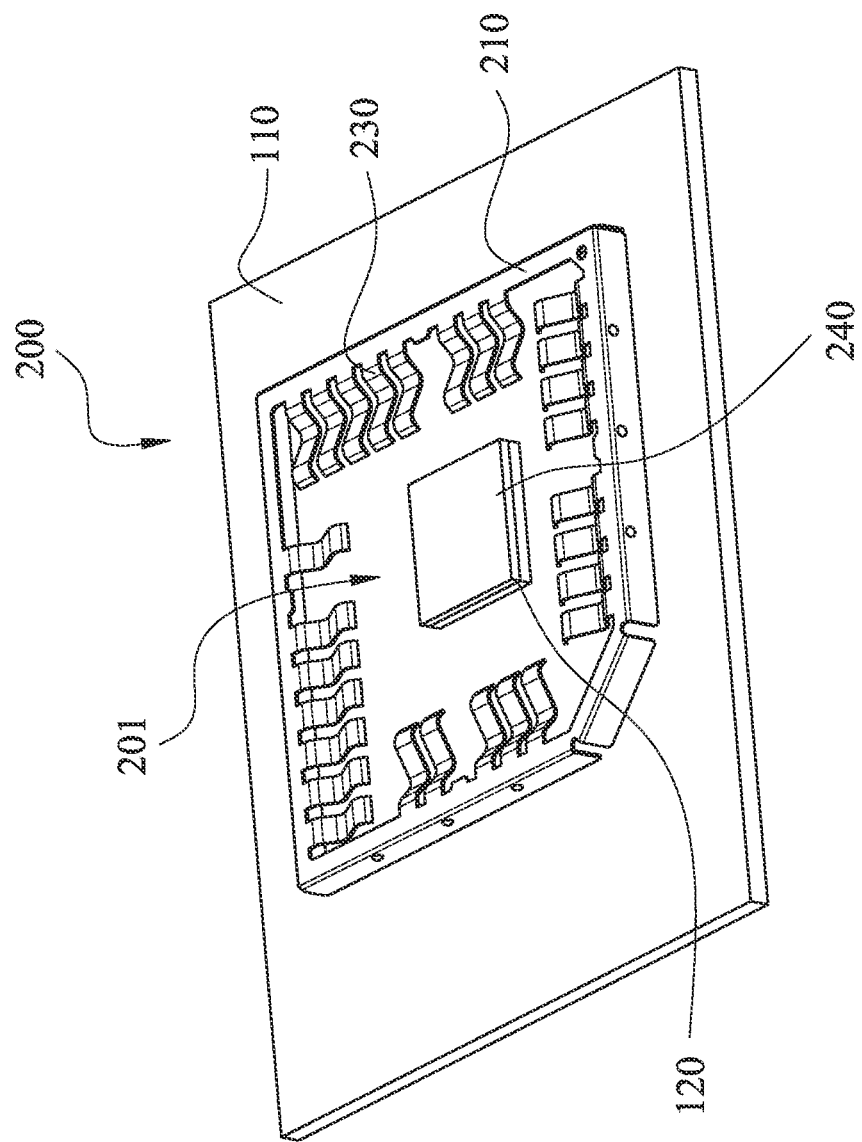
FIG. 3 is a partial schematic view of a heat dissipating electromagnetic shielding structure of the electronic device of FIG. 1.

Please refer to FIG. 1, FIG. 2 and FIG. 3, wherein FIG. 1 is a partial schematic view of an electronic device 100 of the present disclosure, FIG. 2 is an exploded view of the electronic device 100 of FIG. 1, and FIG. 3 is a partial schematic view of a heat dissipating electromagnetic shielding structure 200 of the electronic device 100 of FIG. 1. The electronic device 100 includes a substrate 110, at least one electronic element 120 and a heat dissipating electromagnetic shielding structure 200.

The electronic element 120 is disposed on the substrate 110. In specific, the electronic element 120 can be but not limited to chips, resistors, capacitive components, inductive components, potentiometers, voltage transformers, triodes or diodes, and the substrate 110 can be a circuit board including circuit traces or other necessary components, but the present disclosure is not limited thereto. The heat dissipating electromagnetic shielding structure 200 is disposed on the substrate 110 and covers the electronic element 120, and the heat dissipating electromagnetic shielding structure 200 includes a shielding frame 210 and a heatsink 220.

The shielding frame 210 has a first opening 211 and a second opening 212, the first opening 211 is covered by the substrate 110, and the shielding frame 210 includes a plurality of spring members 230. The spring members 230 are separately disposed on an inner edge of the second opening 212, wherein the spring members 230 are bent toward the substrate 110. As shown in FIG. 2 and FIG. 3, at least some of the spring members 230 can be equidistantly disposed on the inner edge of the second opening 212 so as to enhance the manufacturing efficiency of the spring members 230.

Figure 4:
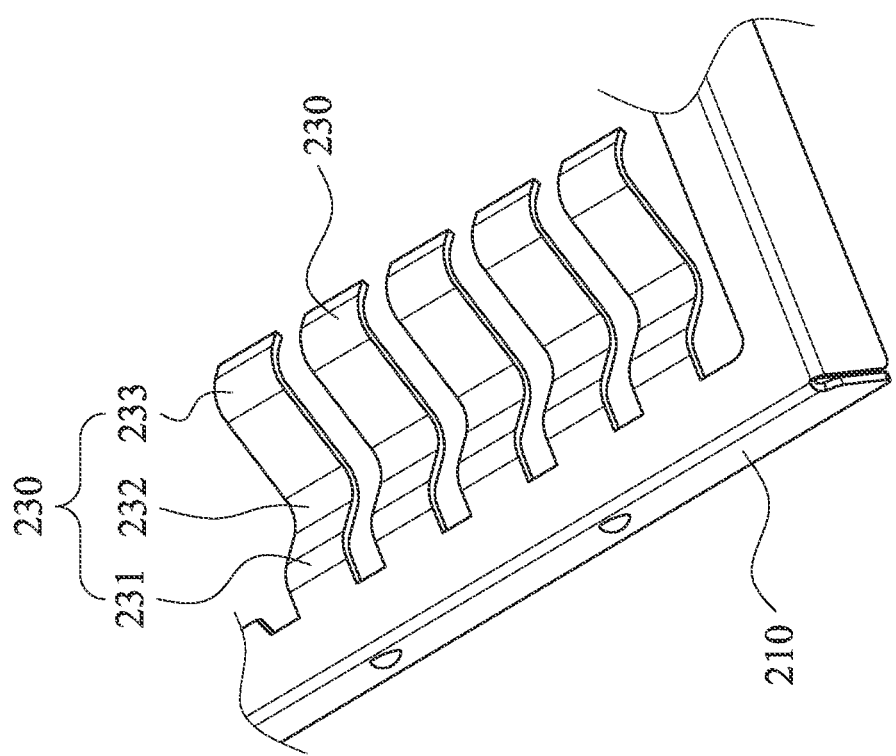
FIG. 4 is a partial enlarged schematic view of spring members of the heat dissipating electromagnetic shielding structure of FIG. 2.

Please refer to FIG. 4, which is a partial enlarged schematic view of the spring members 230 of the heat dissipating electromagnetic shielding structure 200 of FIG. 2. As shown in FIG. 4, at least one of the spring members 230 can include a connecting section 231, a bending section 232 and a cantilever section 233. The connecting section 231 is connected to the shielding frame 210, a bent of the at least one of the spring members 230 toward the substrate 110 is formed by the bending section 232, and the connecting section 231, the bending section 232 and the cantilever section 233 are connected to each other.

Figure 5:
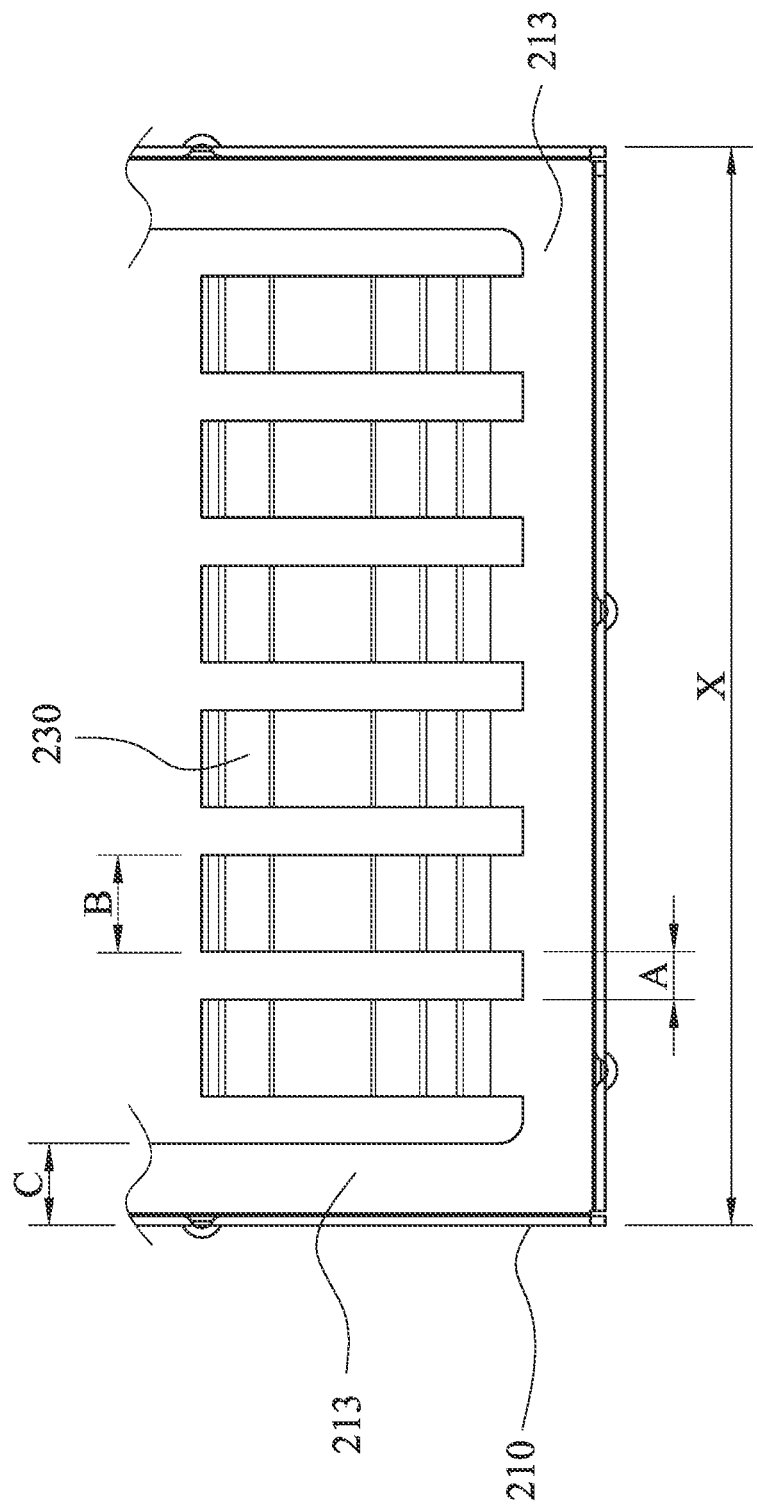
FIG. 5 shows parameters of a shielding frame and the spring members of the electronic device of the present disclosure.

Please refer to FIG. 3, FIG. 4 and FIG. 5 simultaneously, wherein FIG. 5 shows parameters of the shielding frame 210 and the spring members 230 of the electronic device 100 of the present disclosure. It must be noted that FIG. 5 is only for illustrating and describing the definitions and positions of the shielding frame 210 and the spring members 230 of the electronic device 100 of the present disclosure, and the relative position arrangement of the shielding frame 210 and the spring members 230 as well as the number of the spring members 230 of the present disclosure are not limited thereto. As shown in FIG. 3, FIG. 4 and FIG. 5, the shielding frame 210 includes four side frames 213 (there are only three side frames 213 shown in FIG. 5). When a number of the spring members 230 disposed on one side frame 213 of the shielding frame 210 is N, a total length of the side frame 213 is X mm, a width of the side frame 213 is C mm, a distance between two of the spring members 230 disposed adjacent to each other on the side frame 213 is A mm, and a width of each of the spring members 230 is B mm, the following condition can be satisfied:

$$N = \frac{X - A - 2C}{A + B}.$$

Furthermore, when a thickness of the shielding frame 210 is T mm (please refer to the marks shown in FIG. 6 and FIG. 7), and the distance between two of the spring members 230 disposed adjacent to each other on the side frame 213 is A mm, the following condition can be satisfied: $A \geq 1T$. Furthermore, when the width of each of the spring members 230 is B mm, and the width of the side frame 213 is C mm, the following conditions can be satisfied: $B \geq 1.5$ mm; and $C \geq 1.5$ mm. Therefore, the size of each of the spring members 230 as well as the relative position arrangement of the shielding frame 210 and the spring members 230 can be adjusted according to actual needs, and a length of the cantilever section 233 can be further increased or reduced so as to adjust a value of the moment arm thereof, but the present disclosure is not limited to the disclosures of the drawings.

The heatsink 220 is disposed on the shielding frame 210 and covers the second opening 212, and the spring members 230 can partially abut against the heatsink 220. When the heatsink 220 and the shielding frame 210 are correspondingly, a shielding space 201 is defined by the heatsink 220, the shielding frame 210 and the substrate 110, and the electronic element 120 is disposed in the shielding space 201. Thus, a heat generated by the electronic element 120 can be conducted out of the shielding space 201 via the heatsink 220. Furthermore, the heatsink 220 can be made of metal materials with good thermal conductivity, but the present disclosure is not limited thereto.

Therefore, by replacing the shielding cover of the conventional electromagnetic shielding structure with the heatsink 220, not only the number of the elements and the sizes of the heat dissipating electromagnetic shielding structure 200 of the present disclosure can be reduced, but also the conducting efficiency of the heat generated by the electronic element 120 from the electronic element 120 to the heatsink 220 can be effectively enhanced. Hence, the electronic device 100 and the heat dissipating electromagnetic shielding structure 200 of the present disclosure have application potentials in related arts. Furthermore, by the arrangement of the plural spring members 230, it is favorable for providing an elastic force to the heat dissipating electromagnetic shielding structure 200 during the assembling process thereof by the connecting section 231, the bending section 232 and the cantilever section 233 of the at least one of the spring members 230, so that the heatsink 220 can be guided to an expected positioning location of the shielding frame 210 and then further be disposed thereon correspondingly. Therefore, the installing effectivity and the installing success rate of the electronic device 100 and the heat dissipating electromagnetic shielding structure 200 of the present disclosure can be enhanced.

Figure 6:
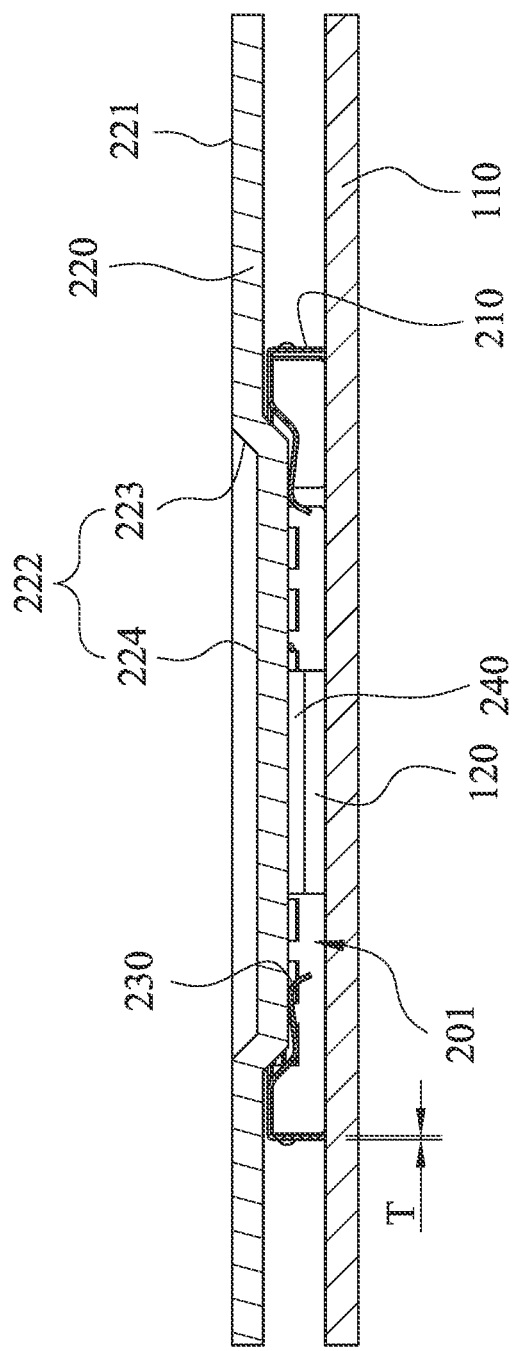
FIG. 6 is a cross-sectional view of the electronic device of FIG. 1 along a cutting line 5-5.

Please refer to FIG. 2 and FIG. 6 simultaneously, wherein FIG. 6 is a cross-sectional view of the electronic device 100 of FIG. 1 along a cutting line 5-5. As shown in FIG. 2 and FIG. 6, the heatsink 220 can include a body 221 and a connecting structure 222, and the connecting structure 222 is disposed on the body 221. A shape of the connecting structure 222 corresponds to a shape of the second opening 212, and a size of the connecting structure 222 is equal to an opening size of the second opening 212. When the heatsink 220 and the shielding frame 210 are correspondingly arranged, the connecting structure 222 correspondingly covers the second opening 212. Thus, the second opening 212 of the shielding frame 210 can be covered completely by the heatsink 220 so as to achieve the aim for electromagnetic shielding.

Figure 7:
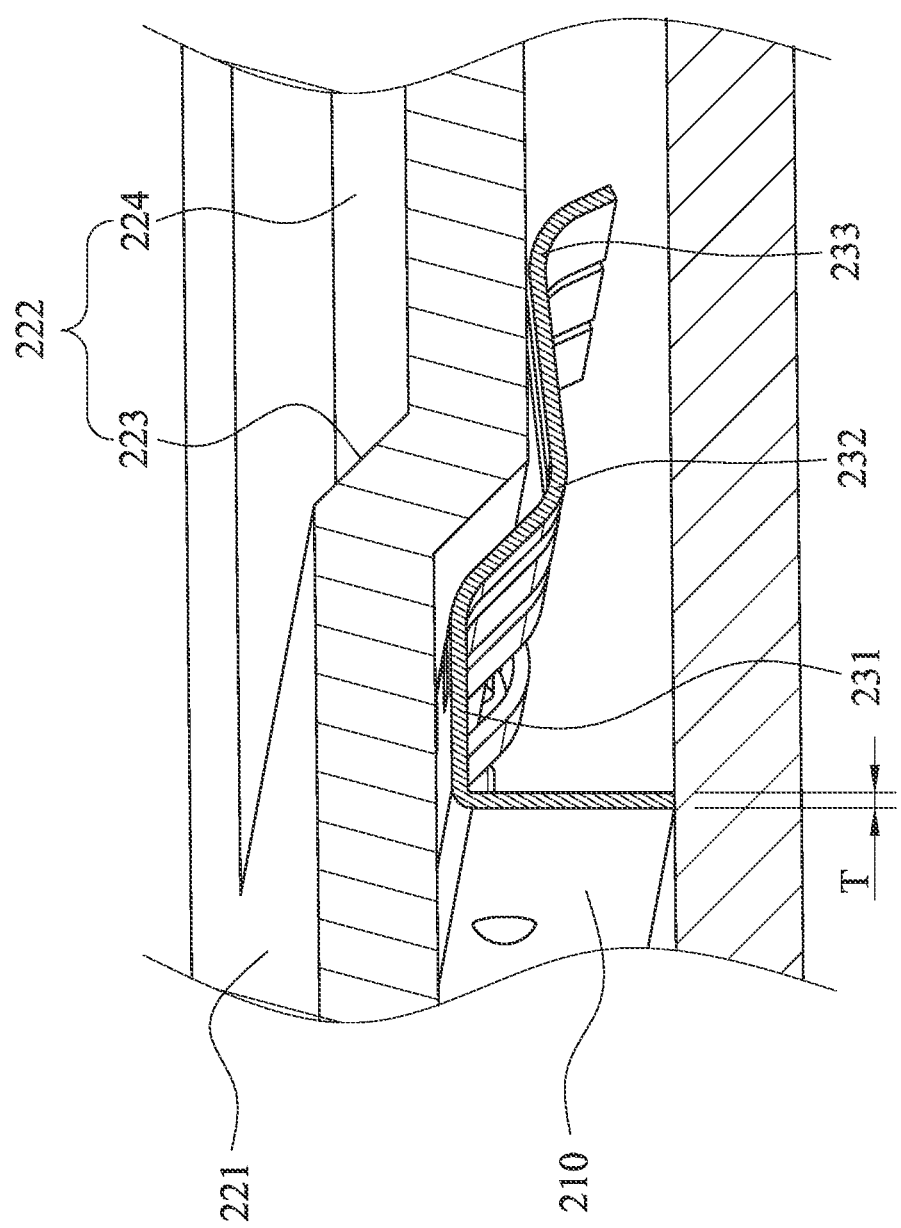
FIG. 7 is a partial enlarged cross-sectional view of the electronic device of FIG. 6.
Figure 8:
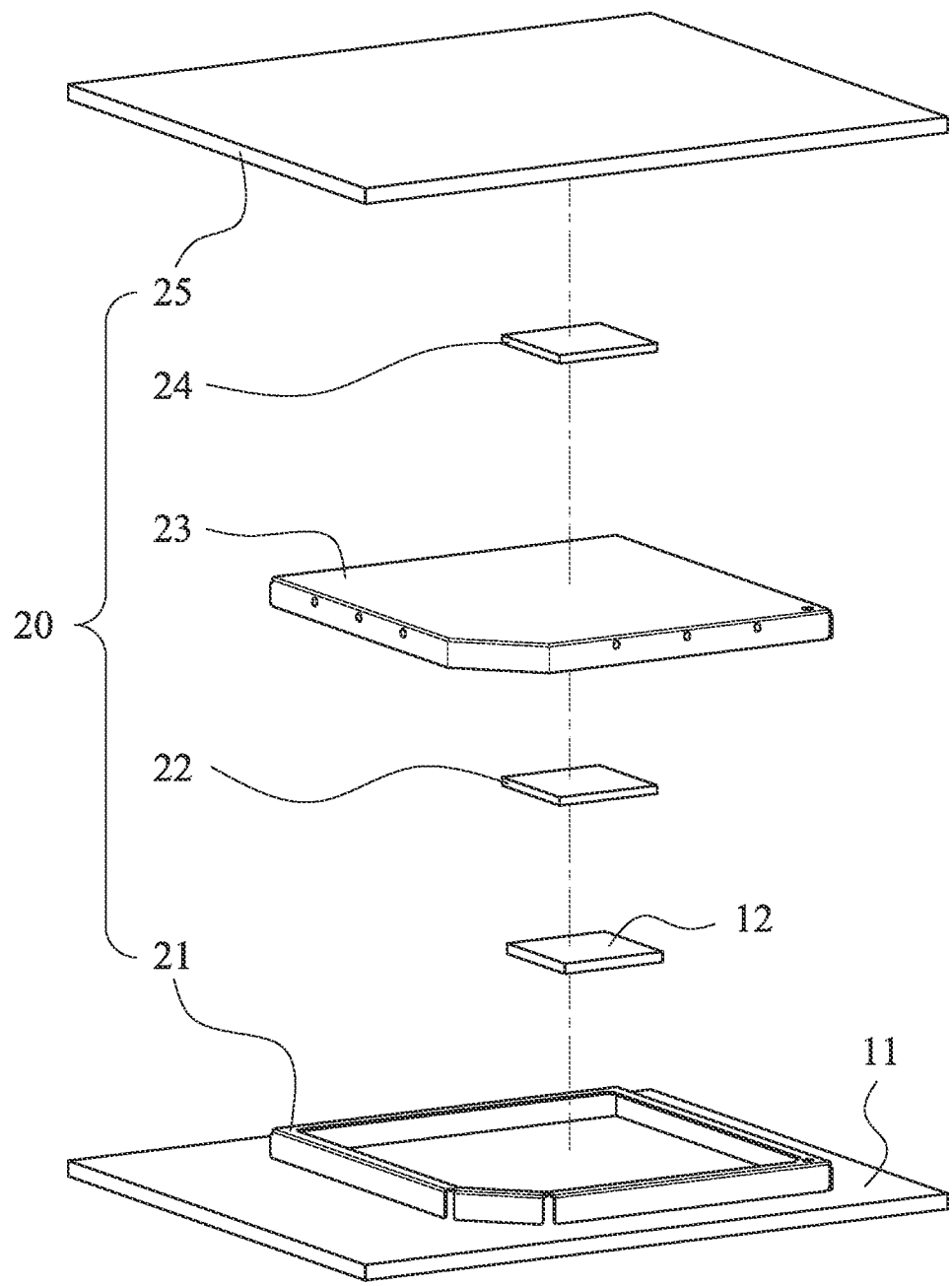
FIG. 8 is an exploded view of a conventional electronic device.

Please refer to FIG. 6 and FIG. 7 simultaneously, wherein FIG. 7 is a partial enlarged cross-sectional view of the electronic device 100 of FIG. 6. As shown in FIG. 6 and FIG. 7, the connecting structure 222 can include a bending portion 223 and a bottom portion 224. In particular, the bending portion 223, the body 221 and the bottom portion 224 are connected. When the heatsink 220 and the shielding frame 210 are correspondingly arranged, the bending portion 223 is corresponding to the bending section 232 of the at least one of the spring members 230, and the cantilever section 233 of the at least one of the spring members 230 abuts against the bottom portion 224. Further, a maximum horizontal height of the cantilever section 233 is smaller than or equal to a horizontal height of the connecting section 231 and is larger than a minimum horizontal height of the bending section 232.

In detail, when the heatsink 220 and the shielding frame 210 are correspondingly arranged, in order to completely cover and seal the gap between the heatsink 220 and the shielding frame 210, the at least one of the spring members 230 of the present disclosure further includes the connecting section 231, the bending section 232 and the cantilever section 233. The connecting section 231 and the shielding frame 210 are connected to each other so as to form a peripheral structure for blocking the leakage of electromagnetic radiation, so that the horizontal height of the connecting section 231 must be higher than the maximum horizontal height of the bending section 232 and the maximum horizontal height of the cantilever section 233. Furthermore, the bending section 232 is bent toward the substrate 110 and corresponds to the bending portion 223 of the heatsink 220 so as to interfere with the electromagnetic radiation in the shielding space 201 and make parts of the electromagnetic radiation restricted in the shielding space 201. Thus, a tightly blocking efficiency of the electromagnetic radiation leakage can be achieved. Moreover, the cantilever section 233 is bent toward the heatsink 220 and has the maximum horizontal height larger than the minimum horizontal height of the bending section 232, so that the cantilever section 233 can abut against the bottom portion 224 of the connecting structure 222 of the heatsink 220.

Therefore, by the arrangement that the cantilever section 233 of the at least one of the spring members 230 abuts against the bottom portion 224 of the connecting structure 222, it is favorable for the spring members 230 to abut against the heatsink 220 and to interfere with the heatsink 220, so that the contact between the spring members 230 and the heatsink 220 can be ensured when the heatsink 220 and the shielding frame 210 are correspondingly arranged. Hence, the blocking property within the shielding space 201 can be maintained, and a better efficiency of electromagnetic shielding can be achieved by the electromagnetic eliminating function of the heatsink 220.

Furthermore, in the embodiment of FIG. 1, the heat dissipating electromagnetic shielding structure 200 can further include at least one thermal pad 240. The thermal pad 240 is disposed between the electronic element 120 and the heatsink 220 (as shown in FIG. 3 and FIG. 6). In detail, the heat generated by the electronic element 120 is partially transferred to the heatsink 220 via the thermal pad 240. Furthermore, although it is not shown in the drawings, the heatsink 220 also can contact to the electronic element 120 directly, and the arrangement of the thermal pad 240 can be omitted. Therefore, the heat generated by the electronic element 120 can be conducted out of the shielding space 201 via the heatsink 220 more effectively, and the cantilever section 233 of the at least one spring member 230 can contact to the connecting structure 222 of the heatsink 220 and then form the shielding space 201, so that the electromagnetic interference can be avoided and the efficiency of electromagnetic shielding can be further enhanced.

Furthermore, it must be noted that the electronic device 100 can include a plurality of the electronic elements 120 and a plurality of the heat dissipating electromagnetic shielding structures 200, the electronic elements 120 can be disposed in the shielding space 201 of one of the heat dissipating electromagnetic shielding structures 200 or respectively disposed in the shielding spaces 201 of different of the heat dissipating electromagnetic shielding structures 200. Further, a number of the thermal pads 240 also can be plural correspondingly to the number of the electronic elements 120, but the present disclosure is not limited to the disclosures of the drawings.

To sum up, the electronic device and the heat dissipating electromagnetic shielding structure of the present disclosure have advantages as follows. First, by the arrangement that the shielding frame includes the spring members, the shielding cover of the conventional electromagnetic shielding structure can be replaced with the heatsink of the electronic device and the heat dissipating electromagnetic shielding structure of the present disclosure, so that the preparing process of the heat dissipating electromagnetic shielding structure can be greatly simplified, and the assembly allowance between elements can be reduced. Thus, the manufacturing efficiency of the electronic device and the heat dissipating electromagnetic shielding structure of the present disclosure can be further enhanced. Second, by the arrangement of the plural spring members, it is favorable for guiding the heatsink of the heat dissipating electromagnetic shielding structure 200 during the assembling process thereof to an expected positioning location by the spring members. Thus, the installing effectivity and the installing success rate of the electronic device and the heat dissipating electromagnetic shielding structure of the present disclosure can be enhanced. Third, by the arrangements that the shielding frame includes a plurality of spring members, the heatsink includes the connecting structure, and the at least one of the spring members includes a connecting section, a bending section and a cantilever section, the gap between the heatsink and the shielding frame can be completely covered and sealed, so that the number of the elements of the heat dissipating electromagnetic shielding structure of the electronic device and the heat dissipating electromagnetic shielding structure of the present disclosure can be effectively reduced under the premise of high efficiency of electromagnetic shielding, and the costs of material and labor of the electronic device and the heat dissipating electromagnetic shielding structure of the present disclosure can be effectively reduced. Hence, the electronic device and the heat dissipating electromagnetic shielding structure have application potentials in related arts.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure covers modifications and variations of this disclosure provided they fall within the scope of the following claims.

What is claimed is:

1. An electronic device, comprising:
a substrate;
at least one electronic element disposed on the substrate; and
a heat dissipating electromagnetic shielding structure disposed on the substrate and covering the at least one electronic element, wherein the heat dissipating electromagnetic shielding structure comprises:
a shielding frame having a first opening and a second opening, wherein the first opening is covered by the substrate, and the shielding frame comprises:
a plurality of spring members separately disposed on an inner edge of the second opening, wherein the spring members are bent toward the substrate, at least one of the spring members comprises a connecting section, a bending section and a cantilever section, the connecting section is connected to the shielding frame, and a bent of the at least one of the spring members toward the substrate is formed by the bending section; and
a heatsink disposed on the shielding frame and covering the second opening, and the spring members partially abutting against the heatsink, wherein the heatsink comprises:
a body; and
a connecting structure disposed on the body and comprising a bending portion and a bottom portion, wherein a shape of the connecting structure corresponds to a shape of the second opening, and a size of the connecting structure is equal to an opening size of the second opening;
wherein when the heatsink and the shielding frame are correspondingly arranged, a shielding space is defined by the heatsink, the shielding frame and the substrate, the at least one electronic element is disposed in the shielding space, and a heat generated by the at least one electronic element is conducted out of the shielding space via the heatsink; and
wherein when the heatsink and the shielding frame are correspondingly arranged, the connecting structure correspondingly covers the second opening, the bending portion is corresponding to the bending section of the at least one of the spring member, and the cantilever section of the at least one of the spring members abuts against the bottom portion.

2. The electronic device of claim 1, wherein a number of the spring members disposed on one side frame of the shielding frame is N, a total length of the one side frame is X mm, a width of the one side frame is C mm, a distance between two of the spring members disposed adjacent to each other on the one side frame is A mm, a width of each of the spring members is B mm, and the following condition is satisfied:

$$N = \frac{X - A - 2C}{A + B}.$$

3. The electronic device of claim 2, wherein a thickness of the shielding frame is T mm, and the following condition is satisfied:

$A \geq 1T$.

4. The electronic device of claim 2, wherein the following conditions are satisfied:

$B \geq 1.5$ mm; and $C \geq 1.5$ mm.

5. The electronic device of claim 1, wherein at least some of the spring members are equidistantly disposed on the inner edge of the second opening.

6. The electronic device of claim 1, wherein a maximum horizontal height of the cantilever section is smaller than or equal to a horizontal height of the connecting section and is larger than a minimum horizontal height of the bending section.

7. The electronic device of claim 1, wherein the heat dissipating electromagnetic shielding structure further comprises:
at least one thermal pad disposed between the at least one electronic element and the heatsink.

8. A heat dissipating electromagnetic shielding structure, which is for performing an electromagnetic shielding to at least one electronic element disposed on a substrate, comprising:
a shielding frame having a first opening and a second opening, wherein the first opening is covered by the substrate, and the shielding frame comprises:
a plurality of spring members separately disposed on an inner edge of the second opening, wherein the spring members are bent toward the substrate, each of the spring members comprises a connecting section, a bending section and a cantilever section, the connecting section is connected to the shielding frame, and a bent of at least one of the spring members toward the substrate is formed by the bending section; and
a heatsink disposed on the shielding frame and covering the second opening, and the spring members partially abutting against the heatsink, wherein the heatsink comprises:
a body; and
a connecting structure disposed on the body and comprising a bending portion and a bottom portion, wherein a shape of the connecting structure corresponds to a shape of the second opening, and a size of the connecting structure is equal to an opening size of the second opening;
wherein when the heatsink and the shielding frame are correspondingly arranged, a shielding space is defined by the heatsink, the shielding frame and the substrate, the at least one electronic element is disposed in the shielding space, and a heat generated by the at least one electronic element is conducted out of the shielding space via the heatsink; and
wherein when the heatsink and the shielding frame are correspondingly arranged, the connecting structure correspondingly covers the second opening, the bending portion is corresponding to the bending section of the at least one of the spring members, and the cantilever section of the at least one of the spring members abuts against the bottom portion.

9. The heat dissipating electromagnetic shielding structure of claim 8, wherein a number of the spring members disposed on one side frame of the shielding frame is N, a total length of the one side frame is X mm, a width of the one side frame is C mm, a distance between two of the spring members disposed adjacent to each other on the one side frame is A mm, a width of each of the spring members is B mm, and the following condition is satisfied:

$$N = \frac{X - A - 2C}{A + B}.$$

10. The heat dissipating electromagnetic shielding structure of claim 9, wherein a thickness of the shielding frame is T mm, and the following condition is satisfied:

$A \geq 1T.$

11. The heat dissipating electromagnetic shielding structure of claim 9, wherein the following conditions are satisfied:

$B \geq 1.5$ mm; and $C \geq 1.5$ mm.

12. The heat dissipating electromagnetic shielding structure of claim 8, wherein at least some of the spring members are equidistantly disposed on the inner edge of the second opening.

13. The heat dissipating electromagnetic shielding structure of claim 8, wherein a maximum horizontal height of the cantilever section is smaller than or equal to a horizontal height of the connecting section and is larger than a minimum horizontal height of the bending section.

14. The heat dissipating electromagnetic shielding structure of claim 8, further comprising:
    at least one thermal pad disposed between the at least one electronic element and the heatsink.

* * * * *